(12) United States Patent
Raaijmakers et al.

(10) Patent No.: US 6,564,810 B1
(45) Date of Patent: May 20, 2003

(54) CLEANING OF SEMICONDUCTOR PROCESSING CHAMBERS

(75) Inventors: Ivo Raaijmakers, Bilthoven (NL); Franciscus B. Van Bilsen, Bertem (BE)

(73) Assignee: ASM America, Phoenix, AZ (US)

( * ) Notice: Subject to any disclaimer, the term of this patent is extended or adjusted under 35 U.S.C. 154(b) by 0 days.

(21) Appl. No.: 09/536,590

(22) Filed: Mar. 28, 2000

(51) Int. Cl.⁷ .................................................. B08B 3/10
(52) U.S. Cl. ........................ 134/1.1; 134/2; 134/22.18; 134/30; 134/902
(58) Field of Search ........................... 134/1.1, 2, 22.1, 134/22.18, 22.19, 30, 34, 902; 438/710, 714, 734, 905; 156/345, 643.1, 345.33, 345.38, 345.4, 345.41, 345.42, 345.45, 345.46, 345.49; 216/37, 67

(56) References Cited

U.S. PATENT DOCUMENTS

| | | | |
|---|---|---|---|
| 3,862,397 A | 1/1975 | Anderson et al. ............ 219/405 |
| 3,900,597 A | 8/1975 | Chruma et al. ................ 427/82 |
| 4,284,867 A | 8/1981 | Hill et al. ............. 219/10.49 R |
| 4,579,080 A | 4/1986 | Martin et al. ................ 118/500 |
| 4,653,428 A | 3/1987 | Wilson et al. ............... 118/725 |
| 4,745,088 A | 5/1988 | Inoue et al. ................. 437/102 |
| 4,747,368 A | 5/1988 | Brien et al. .................. 118/715 |
| 4,760,244 A | 7/1988 | Hokynar ...................... 219/390 |
| 4,794,217 A | 12/1988 | Quan et al. .................. 437/247 |
| 4,820,377 A | 4/1989 | Davis et al. ................. 156/643 |
| 4,870,245 A | 9/1989 | Price et al. .............. 219/121.36 |
| 4,989,540 A | 2/1991 | Fuse et al. ................... 118/719 |
| 5,038,711 A | 8/1991 | Dan et al. .................... 118/715 |
| 5,062,386 A | 11/1991 | Christensen ................ 118/725 |
| 5,082,517 A | 1/1992 | Moslehi ....................... 156/345 |
| 5,348,587 A | 9/1994 | Eichman et al. ....... 118/723 MP |
| 5,373,806 A | 12/1994 | Logar ......................... 117/106 |
| 5,431,769 A | * | 7/1995 | Kisakibaru et al. ....... 118/723 E |
| 5,454,903 A | | 10/1995 | Redeker et al. ................ 216/67 |
| 5,514,246 A | | 5/1996 | Blalock .................... 156/643.1 |
| 5,523,261 A | | 6/1996 | Sandhu ........................ 437/228 |
| 5,531,862 A | * | 7/1996 | Otsubo et al. ................ 134/1.2 |
| 5,534,231 A | | 7/1996 | Savas ............................ 216/67 |
| 5,700,741 A | | 12/1997 | Liao ............................ 438/723 |
| 5,756,400 A | | 5/1998 | Ye et al. ...................... 438/710 |
| 5,811,356 A | | 9/1998 | Murugesh .................... 438/711 |
| 5,817,534 A | | 10/1998 | Ye et al. ......................... 438/10 |
| 5,849,092 A | * | 12/1998 | Xi et al. ....................... 134/1.1 |
| 5,851,307 A | | 12/1998 | Gilmer et al. ............. 134/22.1 |
| 5,879,575 A | | 3/1999 | Tepman et al. ................ 216/68 |
| 5,882,424 A | * | 3/1999 | Taylor et al. ................ 134/1.1 |
| 5,888,414 A | | 3/1999 | Collins et al. ................. 216/68 |
| 5,926,743 A | | 7/1999 | Xi et al. ...................... 438/905 |
| 6,014,979 A | | 1/2000 | Van Autryve et al. ....... 134/1.1 |
| 6,016,131 A | | 1/2000 | Sato et al. .................... 343/895 |
| 6,125,859 A | * | 10/2000 | Kao et al. .................... 134/1.1 |
| 6,192,898 B1 | * | 2/2001 | Aitani et al. ................. 134/1.1 |
| 6,271,148 B1 | * | 8/2001 | Kao et al. .................... 438/727 |
| 6,379,575 B1 | * | 4/2002 | Yin et al. ..................... 134/1.1 |
| 6,401,728 B2 | * | 6/2002 | Chow et al. ................. 134/1.1 |
| 6,425,953 B1 | * | 7/2002 | Johnson .................... 118/723 I |

FOREIGN PATENT DOCUMENTS

| | | | |
|---|---|---|---|
| EP | 0829784 | 3/1998 | |
| JP | 57-079620 | * 5/1982 | ......... H01L/21/302 |

* cited by examiner

*Primary Examiner*—Frankie L. Stinson
(74) *Attorney, Agent, or Firm*—Greenlee, Winner and Sullivan, P.C.

(57) ABSTRACT

A method of removing deposits from selected areas of a substrate-processing chamber comprising applying RF energy to a coil located around selected areas of the chamber is provided. Also provided is a substrate-processing chamber with improved cleaning properties having a coil capable of being coupled with an RF field disposed at selected areas of the chamber.

20 Claims, 6 Drawing Sheets

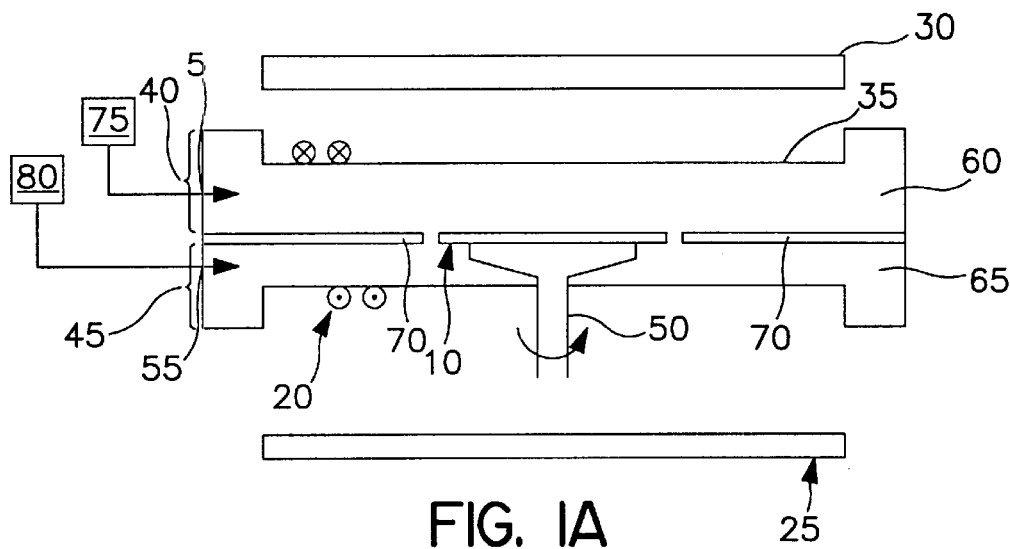
FIG. IA
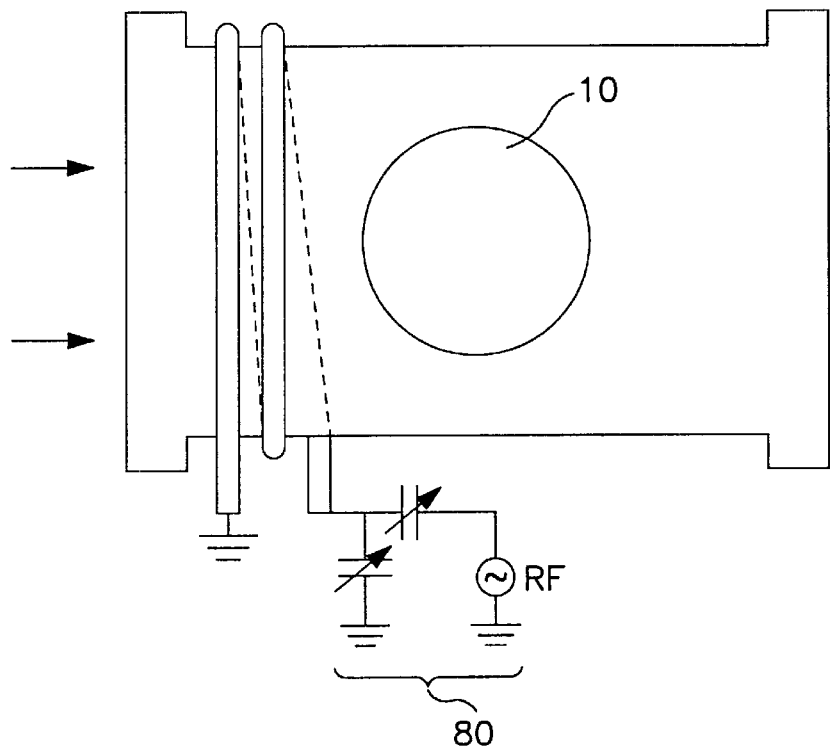
FIG. IB

CLEANING OF SEMICONDUCTOR PROCESSING CHAMBERS

BACKGROUND OF THE INVENTION

This invention is in the field of semiconductor processing and more specifically methods to clean semiconductor processing chambers and semiconductor processing chambers having improved cleaning.

In the chemical vapor deposition (CVD) process used to manufacture semiconductor wafers, the substrate (wafer) is heated in a chamber, activating a chemical reaction which deposits a film of material on the surface of the wafer. The CVD process typically occurs on the wafer as well as on the walls and other surfaces in the chamber. The film on the walls of the chamber and other surfaces must be removed to prevent the coating from flaking off and forming particles on the wafer which degrades wafer quality.

Certain areas of the walls of the chamber are heated more than other areas due to nonuniformity of output from heating lamps, different thicknesses of the walls, and other factors. Because of these nonuniformities, some areas of the chamber are coated more than other areas during the deposition process.

To remove the coating on the interior surfaces of the chamber, various cleaning methods have been developed. One cleaning method is a high temperature plasma or chemical etch using reactive species. A remote microwave plasma source (discussed, for example, in U.S. Pat. No. 5,082,517 (Moslehi)) or radio frequency (RF) radical generator may be used to activate a halogen containing gas. Radio frequencies are frequencies between about 10 kHz and about 300,000 MHz and are typically used in semiconductor processing to generate excited species, including radicals. These species are capable of removing deposits on various surfaces.

U.S. Pat. No. 5,454,903 (Redeker et al.) describes a method of cleaning the interior of a plasma etch reactor or a CVD reactor at pressures greater than 1.0 Torr by introducing an etchant gas such as $NF_3$ and an electron donor gas such as helium into the chamber and applying RF power at megahertz frequencies.

U.S. Pat. No. 5,817,534 (Ye et al.) describes a method of cleaning a plasma reactor during plasma etching of a semiconductor wafer. This process involves using charged particles generated by a plasma during processing to remove contaminant particles at a rate which reportedly offsets the rate at which particles are deposited.

U.S. Pat. No. 5,879,575 (Tepman et al.) describes a method of cleaning a reaction chamber during plasma etching reactions by directing a portion of the plasma to the inner surface of the reactor using a rotating electrode.

The processes used to clean the surfaces of the reactor have disadvantages. A high temperature etch, with for example, HCl reduces the throughput of the chamber and contributes to premature wearing out of components in the reactor. A remote microwave plasma source is expensive and is not very efficient because of the substantial distance between the source and the surfaces to be cleaned.

None of the methods known to the art describe methods to locally clean selected portions of a reaction chamber.

BRIEF SUMMARY OF THE INVENTION

Provided is a method of removing deposits from a substrate processing chamber, comprising:

(a) introducing into said chamber a first chemical capable of removing deposits upon application of RF energy; and (b) applying RF energy to a coil located around selected areas of said chamber.

The coil is located around selected areas of the chamber, including those areas in the chamber which undergo greater deposition during substrate processing than other locations in said chamber. The coil may be disposed in various areas near or around the chamber, including near the inlet end of the substrate processing chamber, near the outlet end of the substrate processing chamber, near both the inlet end and the outlet end of the substrate processing chamber, near the bottom portion of the substrate processing chamber, near the top portion of the substrate processing chamber, near both the top and bottom portions of the substrate processing chamber, and other areas, as selected. The RF energy may be applied to various volumes of the chamber. For example, RF energy may be applied to less than about 75% of the total volume of the chamber, less than 50% of the total volume of the chamber, or less than 25% of the total volume of the chamber. The RF coil may be disposed around less than the entire chamber. For example, the coil may be disposed around less than 75% of the length of the chamber, less than 50% of the length of the chamber, or less than 25% of the length of the chamber, as needed or desired.

The first chemical can be introduced into the chamber in places coordinated with the location of application of RF energy. The selective RF field of this invention is not applied during substrate processing. It is applied as appropriate between steps of substrate processing. Typically, a cleaning cycle is periodically performed after one or more substrate processing cycles have been completed. A second chemical capable of removing deposits, either alone or in combination with said first chemical may also be introduced into the chamber. The second chemical can be introduced into the chamber in different locations than the first chemical. Also provided is a method of removing deposits from a substrate processing chamber containing a certain level of one or more chemicals capable of removing deposits comprising: introducing into a first area of said chamber a higher concentration of one or more chemicals capable of removing deposits, whereby the concentration of one or more chemicals is increased at a second area of said chamber. The first and second areas may be the same area, or may be different. There may be more than one first area and second area in a given chamber. Different chemicals may be introduced in different first areas.

The chamber may also be heated in combination with localized RF application. The areas in the chamber that are heated include those areas which undergo greater deposition during substrate processing than other locations in said chamber. Selected areas of the chamber may be heated by plasma generated by RF, or heating lamps, for example. The heating lamps may be infrared heating lamps and may direct energy to the entire chamber or to selected areas of the chamber.

Also provided is a method of cleaning a substrate in a substrate processing chamber, said method comprising:

(a) introducing a gas that generates radicals or other reactive species into said chamber that also contains a substrate;

(b) applying RF energy to a coil located around selected areas of said chamber.

This method may further comprise:

(c) depositing a desired substance onto said substrate.

Also provided is an apparatus with improved cleaning properties, the apparatus comprising:

(a) a substrate processing chamber having an inlet end and an outlet end and a top and a bottom portion;
(b) a coil capable of being coupled with an RF field, said coil being disposed at selected areas of said chamber; and
(c) a source of RF energy coupled with said coil; and
(d) a control for selective application of RF energy during a selected cleaning cycle.

The apparatus may also include a heat source, which directs more heat to certain areas locations of said substrate processing chamber than other areas of said substrate processing chamber. The heat source may be a lamp, and the lamp may emit energy in the infrared range.

As used herein, "selected areas" generally means areas where the placement of a coil, combined with an RF field, combined with one or more chemicals reduces the amount of deposited materials on the walls. "Selected areas of the chamber" to which the coil is located include areas where deposition of materials during substrate processing is higher than at other areas of said chamber. "Selected areas" may be upstream or downstream of the deposition. Placement of the coil and introduction of gases may be determined experimentally, by the methods described herein. Using the methods and apparatus described herein, the excitation source is much closer to the to-be etched surfaces than in other methods used for cleaning reactors, which results in a highly effective clean with application of lower RF powers. Using the methods and apparatus described herein, even short-lived H radicals can be effectively generated and transported in the gas stream to clean hydrocarbons, native oxide and other materials. The use of a remote plasma source does not offer these advantages.

Chemicals that may be used include gases. Some preferred gases are $NF_3$, $HCl$, $Cl_2$, $H_2$, $ClF_3$, $F_2$, $SF_6$, $CF_4$, $C_2F_6$, other halogen-containing gaseous compounds and mixtures thereof, with $NF_3$, $HCl$, $Cl_2$ and $H_2$ being more preferred. Any other gas or mixtures of gases that is capable of removing deposits upon application of RF energy may also be used. This gas or gases may be present in the chamber before application of RF energy, or gases may be introduced in the chamber during or after RF energy is applied. Other chemicals that are capable of removing deposits upon application of RF energy are included in the invention. The gas may also be diluted in an inert gas, or in a noble gas which, in a plasma, generates metastable species which effectively excite the cleaning gas. "Cleaning" chemicals are typically only introduced into the chamber during cleaning cycles when the substrate is not present.

Chemicals are introduced into the chamber by means such as ports, valves, direct injection, and other means as known in the art.

As used herein, "deposits" include any material that is present on a surface on or in a reactor that is desired to be removed. Deposits include, for example, a film of the substances used during CVD processing of a wafer or other workpiece that is present on the chamber walls or parts of the chamber walls. Deposits may also include other byproducts formed during substrate processing that are present in a reactor.

As used herein, "removing deposits" indicates a reduction of the amount of deposits. It is not necessary for all deposits to be completely removed, and it is not necessary for deposits to be removed from all areas on or in the chamber.

Chambers capable of being used in the invention include plasma reactors, CVD reaction chambers and other chambers that experience deposition of material on the internal surfaces and are capable of having an RF coil in close enough proximity to cause excitation of chemicals and consequent removal of deposits. Chambers may be single-wafer reactors.

"Coil" or "RF coil" takes its meaning as known in the art. RF energy is applied to the coil using means known in the art, including matching networks and RF sources.

Frequencies that are useful in the invention to be applied to a coil include those included in the radio frequencies, preferably those frequencies between about 400 KHz and about 60 MHz. Frequencies include both those frequencies of greater than MHz and less than MHz.

BRIEF DESCRIPTION OF THE DRAWINGS

FIG. 1A (side view) and FIG. 1B (top view) shows an RF coil positioned around one end of a horizontal reactor.

DETAILED DESCRIPTION OF THE INVENTION

Figure 2A:
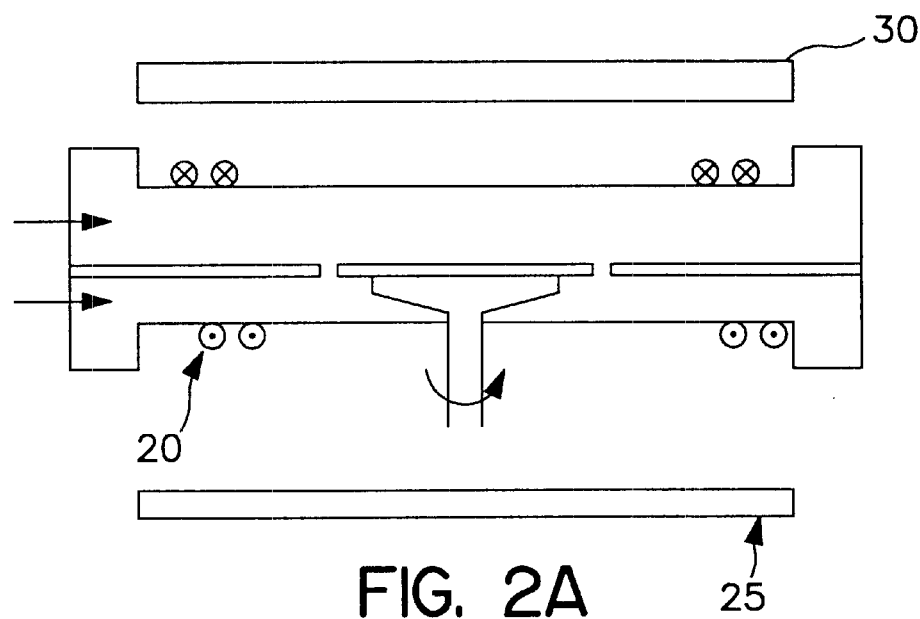
FIG. 2A (side view) and FIG. 2B (top view) shows an RF coil positioned around both ends of a horizontal reactor.

The invention may be further understood by reference to the drawings where the same numbers are used to indicate like features.

FIG. 1A shows one embodiment of the invention as illustrated in a horizontal reactor. Gases from gas sources 75 and 80 are connected to chamber 35 through inlet ports 5 and 55. Alternatively, additional inlets may be used in other places in the chamber, as described further below. Different gases or concentrations of gases may be used in inlet ports 5 and 55, or the same gases may be used. There may be more than one inlet port that may be positioned in different areas of the chamber. Gases flow from inlet ports 5 and 55 to outlet ports 60 and 65. Chamber 35 is made of quartz or other insulating material and has an upper portion 40 and a lower portion 45. Spacers 70 separate the lower portion and the upper portion of chamber 35. A wafer or other workpiece may be placed on susceptor 10. Susceptor 10 may be rotated in the horizontal plane using rotator 50. Upper lamp bank 30 and lower bank 25 are directed so that at least some of the lamp output is incident on chamber 35 and susceptor 10. The chamber walls are preferably transparent to the IR radiation of the lamps, and usually are made from quartz. Coil 20 is positioned around chamber 35 near the inlets. Coil 20 may be any coil suitable for maintaining an RF field. As a specific example, coil 20 may be a water-cooled coil grounded on one end and connected to an RF source via matching network 80, as shown in FIG. 1B. Matching networks are designed to match the source impedance to the load impedance to couple RF power from the source to the load with low resistance and a high percent of power transmitted to the load from the source. Matching networks are described in, for example, U.S. Pat. No. 5,952,896 (Mett, et al.). The design of the coil, matching network, RF generator and suitable frequency depend on the geometry used and are well known to those of ordinary skill in the art.

In operation, gas from gas sources 75 and 80 passes through inlets 5 and 55 into chamber 35. Gas flows through the upper chamber 40 and the lower chamber 45, where it is excited by radio frequency from coils 20. Radicals and other excited species are generated and flow through upper chamber 40 and lower chamber 45 towards outlets 60 and 65 to clean the surfaces of the reactor.

Frequencies that are most useful are in the range of 400 KHz to 60 MHz, although any frequency that excites the species present in the chamber to perform the desired cleaning function may be used. Higher frequencies tend to increase the density of the plasma, and are preferred. Typical pressures during clean are in the range of 100 mtorr to 100 torr. Suitable gases include $NF_3$, HCl, $Cl_2$, $H_2$ $ClF_3$, $F_2$, $SF_6$, $CF_4$, $C_2F_6$ and other gases known to the a The RF field is applied to the chamber until the desired cleaning is achieved.

In an alternative embodiment, chamber 35 is heated in combination with localized RF application during cleaning. This improves the cleaning efficiency of the process. The chamber may be heated at places where build-up is particularly heavy, or other places as desired.

Figure 2B:
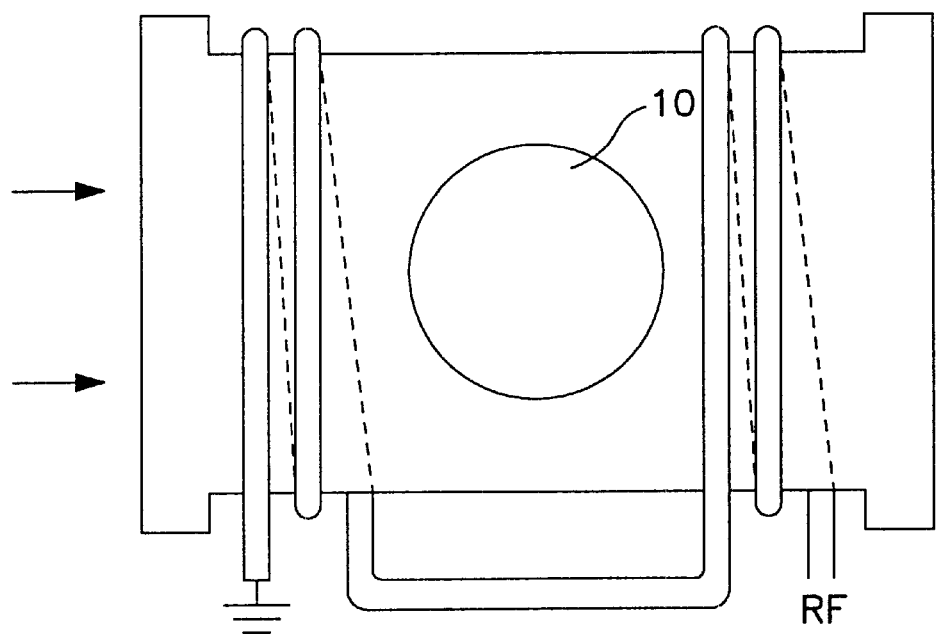
Figure 3A:
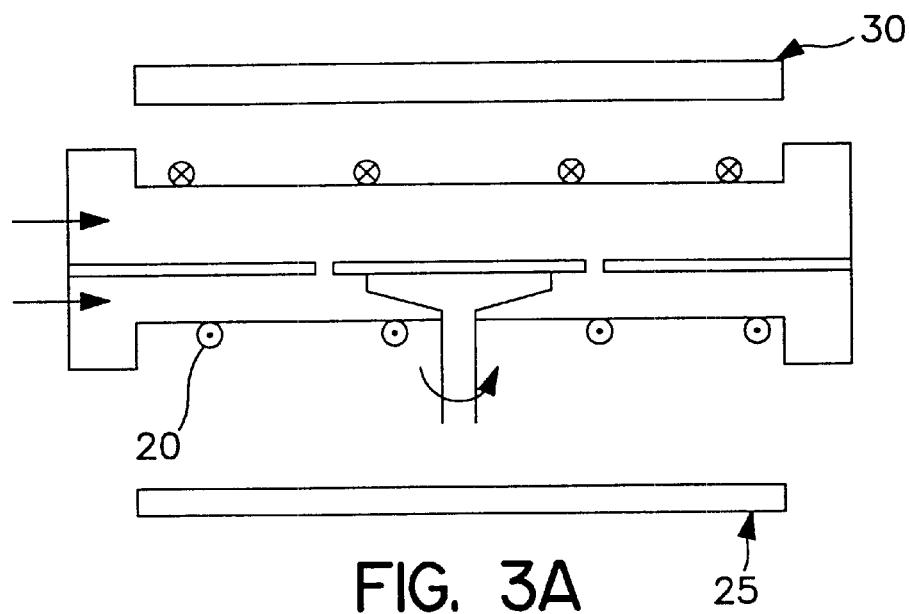
FIG. 3A (side view) and FIG. 3B (top view) shows an RF coil positioned around a horizontal reactor.
Figure 3B:
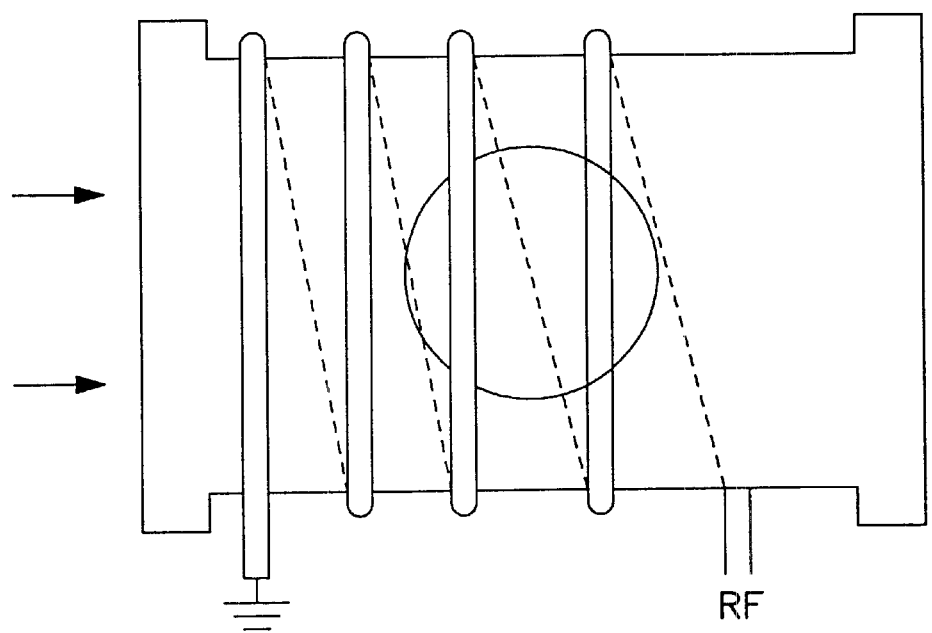
Figure 4A:
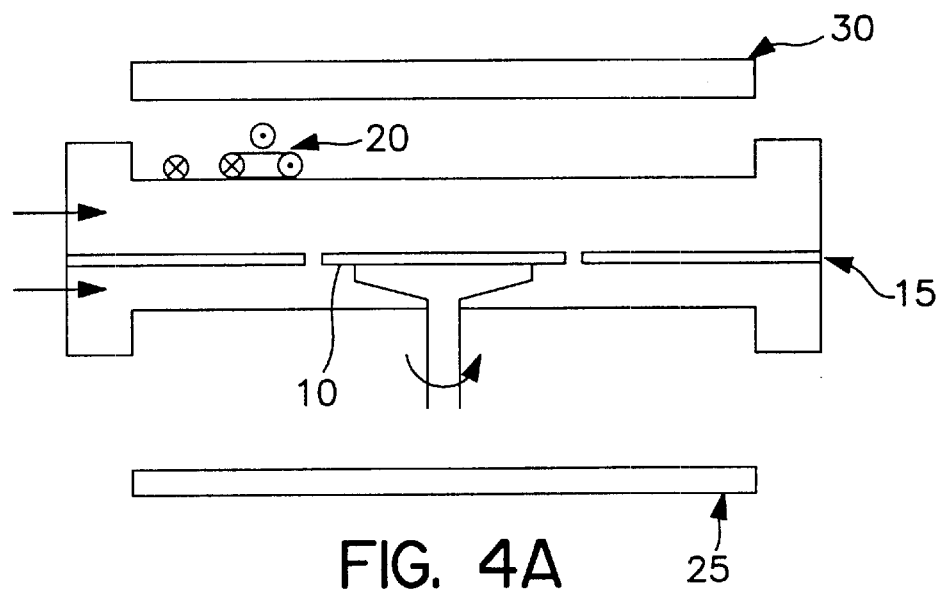
FIG. 4A (side view) and FIG. 4B (top view) shows an RF coil positioned at one end of a top surface of a horizontal reactor.
Figure 4B:
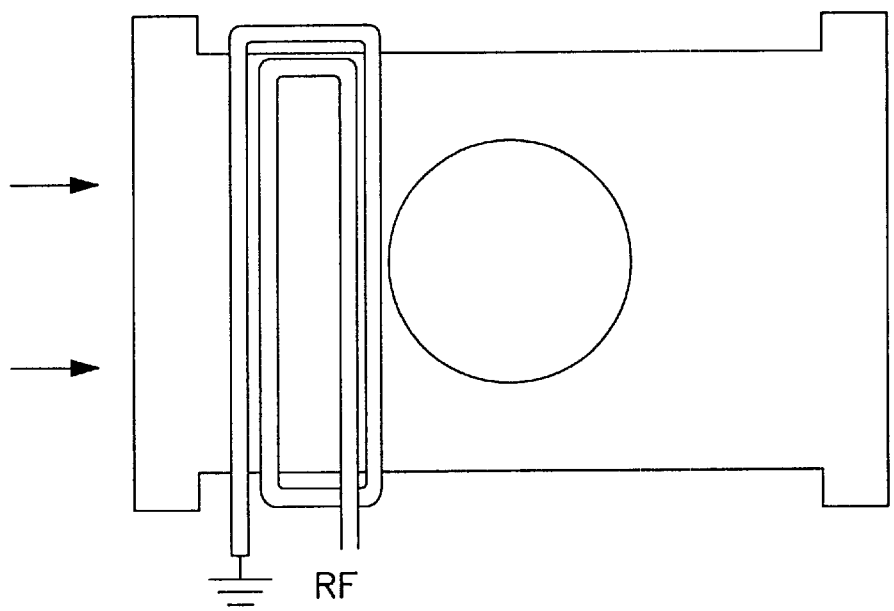

RF coil 20 is shown in FIGS. 1A and 1B as wound around the chamber near the inlet ports. Radicals generated by RF energy can travel downstream from where they are generated. Downstream refers to a position in the chamber that is further along the gas flow stream than another position. Generally, downstream radicals perform etching. The RF coil may be located in a clean area, and the gas flow may carry excited species to contaminated areas of the chamber. In one alternative, RF coil 20 may be wound around the chamber near both the inlet ports and the outlet ports, as shown in FIGS. 2A and 2B. In another alternative, RF coil 20 may be wound around a larger section of the chamber, as shown in FIGS. 3A and 3B. RF coil 20 may also be positioned so that the gas in the upper compartment of the chamber is predominantly excited, as shown in FIGS. 4A and 4B.

Figure 5:
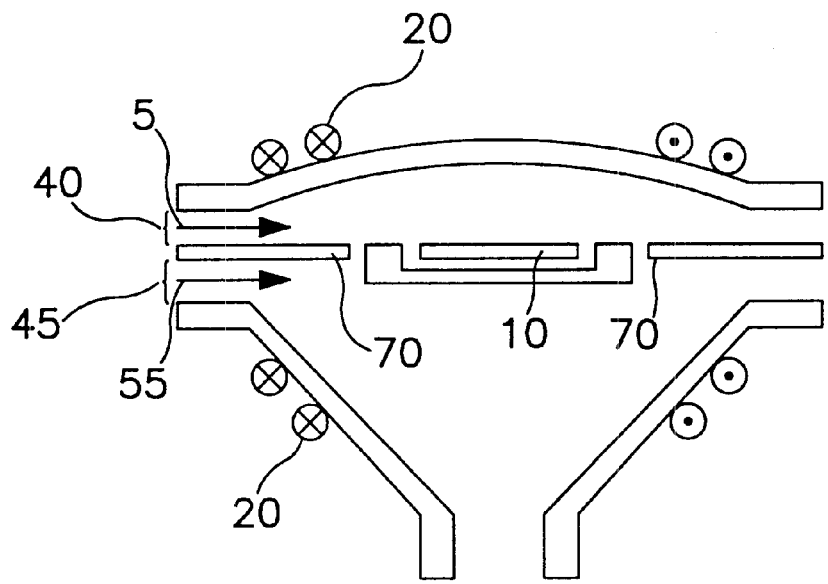
FIG. 5 shows RF coils positioned around a chamber with a different configuration.
Figure 6:
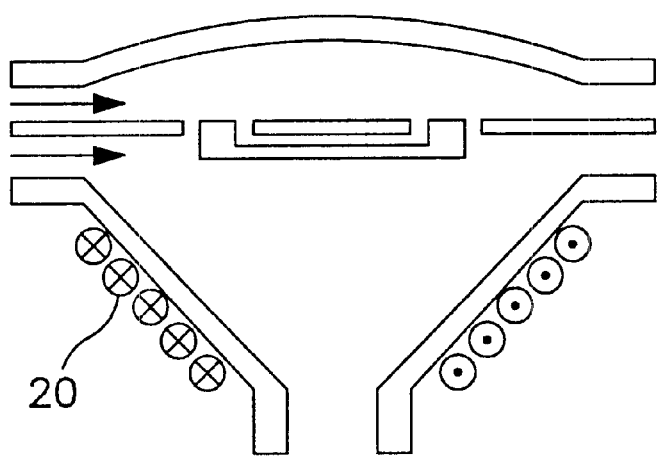
FIG. 6 shows RF coils positioned around the bottom of a chamber with a different configuration.
Figure 7:
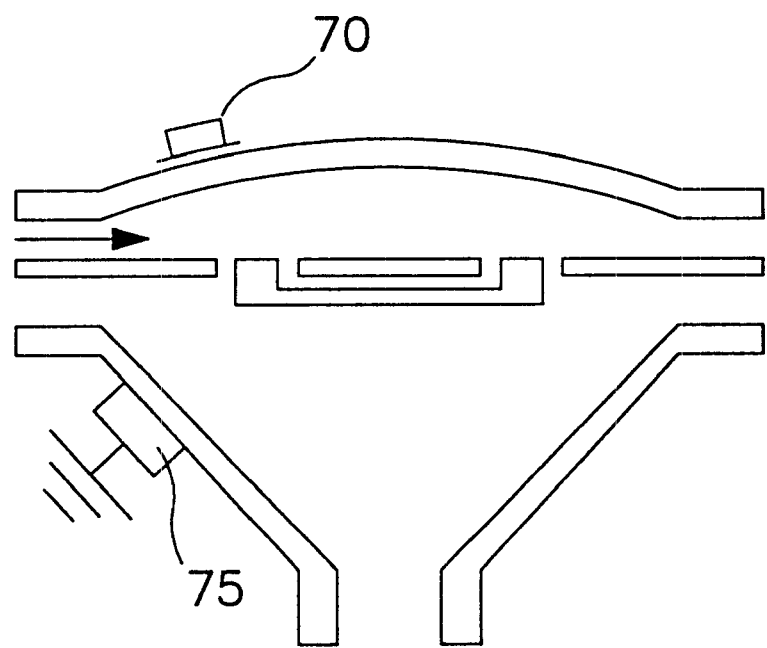
FIG. 7 shows capacitive coupling of RF energy in the gas in the chamber.

The use of the invention in an alternative reaction system is shown in FIGS. 5–7. In the chamber design shown in FIGS. 5–7, contamination tends to build up in the bottom compartment of the chamber which is difficult to clean with other techniques, including a high temperature HCl etch, so excitation of gases in the bottom compartment of the chamber is particularly useful.

Various configurations of the RF coil may be used in the chamber systems shown in FIGS. 5–7. As nonlimiting examples, FIG. 5 shows the RF coil positioned along the inlets and outlets. FIG. 6 shows the RF coil positioned along the bottom section of the reactor. FIG. 7 shows an alternate embodiment of the invention based on capacitive coupling of RF energy in the gas in the chamber, where 70 is a top capacitor plate and 75 is a bottom capacitor plate. Uses and methods of using capacitive coupling are known to the art.

The invention may be used in many other different chamber configurations. In addition to the horizontal flow reactor shown in FIGS. 1–4, the invention may be used in any other reactor chamber design by application of the principles herein and modifications known to the art without undue experimentation. For example, the invention may be used in barrel or cylindrical reactors and vertical systems. The invention is preferably used in single-wafer reactors. In addition to the positions of coils specifically shown in the figures, coils may be placed in any desired area around the chamber or a portion of the chamber.

Chemicals can be introduced into localized areas of the chamber to increase the chemical composition and thereby increase the etch rate at localized areas. These chemicals can be introduced via additional gas inlets or other means as known in the art. For example, if a particular area in the chamber is coated to a greater extent than other areas, a gas inlet can be positioned so that this area receives a higher concentration of chemicals than other areas. These chemicals may be the gases used in the other inlets, or may be other chemicals useful for cleaning the chamber. Increasing the chemical concentration at localized areas will increase the etch rate. Positioning of these inlets to accomplish the objectives is well understood by those of ordinary skill in the art without undue experimentation.

A method of removing deposits from a substrate processing chamber containing a certain level of one or more chemicals capable of removing deposits comprising introducing into selected areas of said chamber a higher concentration of one or more chemicals capable of removing deposits, whereby the concentration of one or more chemicals is increased at selected areas of said chamber is also provided. This method may also include applying RF energy to a coil located around selected areas of said chamber, and may also include applying heat to said chamber.

Another method used to clean the chamber more effectively includes heating the chamber hotter and faster than is conventionally used. This heat treatment is believed to improve the effectiveness of the cleaning chemistry. The energetic plasma created by the coil will lose energy to the walls, thereby selectively heating the wall where the plasma is generated. Typically the wall temperature of a quartz wall can be heated to 100–400° C. by applying around 0.5–3 kW of RF energy for 30 seconds.

For the chamber cleaning applications of this invention, there is no wafer on the susceptor. The invention may also be used to preclean a wafer loaded on the susceptor by admitting $H_2$ or other gas capable of removing desired materials from the wafer or surface of the wafer and activating the gas by applying RF energy to the coil. After the cleaning step, a layer can be deposited, e.g., by CVD, in the same chamber. This provides extremely clean interfaces.

Any combination of the methods described herein that accomplishes the objectives may be used. For example, the techniques of selective placement of cleaning chemicals and the improved heat treatment may be combined, and may be combined with the localized placement of RF fields described herein.

Although the description above contains many specificities, these should not be construed as limiting the scope of the invention but as merely providing illustrations of some of the presently-preferred embodiments of the invention. For example, the RF coil may be positioned around or near any selected area. Thus the scope of the invention should be determined by the appended claims and their legal equivalents, rather than by the examples given. All references cited herein are hereby incorporated by reference to the extent not inconsistent with the disclosure herein.

We claim:

1. A method of removing deposits from a substrate processing chamber, comprising:

(a) introducing into said chamber a first chemical capable of removing deposits upon application of RF energy; and (b) applying RF energy to a coil located around selected areas of said chamber, wherein selective RF energy is not applied to said coil during substrate processing and deposits are removed from at least part of the walls of the chamber.

2. The method of claim 1, wherein the chamber is a single-wafer reactor.

3. The method of claim 1, wherein said first chemical is selected from the group consisting of: $NF_3$, HCl, $Cl_2$, $H_2$, $ClF_3$, $F_2$, $SF_6$, $CF_4$, $C_2F_6$ and mixtures thereof.

4. The method of claim 1, wherein said selected areas are those areas in said chamber which undergo greater deposition during substrate processing than other areas in said chamber.

5. The method of claim 1, wherein said applying step does not occur during substrate processing.

6. The method of claim 1, further comprising introducing into said substrate processing chamber a second chemical capable of removing deposits, either alone or in combination with said first chemical.

7. The method of claim 6, wherein said second chemical is introduced into said chamber in a different location than said first chemical.

8. The method of claim 1, further comprising applying heat to said chamber.

9. The method of claim 8, wherein said heat applied to said chamber is infrared radiation.

10. The method of claim 9, wherein the infrared radiation is generated by one or more lamps.

11. The method of claim 8, wherein said heat is applied to areas of the chamber which undergo greater deposition during substrate processing than other areas in said chamber.

12. The method of claim 8, wherein said heat applied to said chamber is plasma generated by RF.

13. The method of claim 12, wherein said heat is applied to areas of the chamber which undergo greater deposition during substrate processing than other areas in said chamber.

14. The method of claim 1, wherein the concentration of the chemical capable of removing deposits upon application of RF energy is higher at a first area of the chamber than at other areas of the chamber.

15. A method of removing deposits from a substrate processing chamber comprising
   (a) introducing into said chamber a chemical capable of removing deposits wherein the concentration of the chemical is higher at a first area of the chamber than at other areas of the chamber whereby deposits are removed at an increased rate at the first area of the chamber; and
   (b) applying RF energy to a coil located around selected areas of said chamber.

16. A method of cleaning a substrate in a substrate processing chamber, said method comprising:
   (a) introducing a gas that generates radicals or other reactive species into a chamber that also contains a substrate; and
   (b) applying RF energy to a coil located around selected areas of said chamber, wherein selective RF energy is not applied to said coil during substrate processing and deposits are removed from at least part of the walls of the chamber.

17. The method of claim 16, wherein said chamber is a single-wafer reactor.

18. The method of claim 16, wherein said substrate is located downstream of the coil.

19. The method of claim 16, further comprising:
   (c) depositing a desired substance onto said substrate.

20. The method of claim 16, wherein the concentration of the gas that generates radicals or other reactive species upon application of RF energy is higher at a first area of the chamber than at other areas of the chamber.

* * * * *

UNITED STATES PATENT AND TRADEMARK OFFICE
CERTIFICATE OF CORRECTION

PATENT NO.     : 6,564,810 B1
DATED          : May 20, 2003
INVENTOR(S)    : Raaijmakers et al.

It is certified that error appears in the above-identified patent and that said Letters Patent is hereby corrected as shown below:

Column 3,
Line 10, please replace "areas locations" with -- areas or locations --.
Line 18, please replace "to which the coil is located" with -- around which the coil is located --.

Column 5,
Line 15, please replace "known to the a" with -- known to the art --.

Signed and Sealed this

Thirtieth Day of September, 2003

JAMES E. ROGAN
*Director of the United States Patent and Trademark Office*